(12) United States Patent
Lunev et al.

(10) Patent No.: US 9,184,346 B2
(45) Date of Patent: Nov. 10, 2015

(54) ULTRAVIOLET REFLECTIVE CONTACT

(71) Applicant: Sensor Electronic Technology, Inc., Columbia, SC (US)

(72) Inventors: Alexander Lunev, Columbia, SC (US); Alexander Dobrinsky, Providence, RI (US); Maxim S. Shatalov, Columbia, SC (US); Remigijus Gaska, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 65 days.

(21) Appl. No.: 13/711,675

(22) Filed: Dec. 12, 2012

(65) Prior Publication Data

US 2013/0146907 A1 Jun. 13, 2013

Related U.S. Application Data

(60) Provisional application No. 61/569,416, filed on Dec. 12, 2011.

(51) Int. Cl.
| | |
|---|---|
| *H01L 29/22* | (2006.01) |
| *H01L 33/32* | (2010.01) |
| *H01L 29/45* | (2006.01) |
| *H01L 29/20* | (2006.01) |

(Continued)

(52) U.S. Cl.
CPC ............ *H01L 33/32* (2013.01); *H01L 29/2003* (2013.01); *H01L 29/45* (2013.01); *H01L 33/42* (2013.01); *H01L 33/405* (2013.01)

(58) Field of Classification Search
CPC ......... H01L 29/20; H01L 29/45; H01L 33/32; H01L 29/2003; H01L 33/42; H01L 33/405; H01L 33/06; H01L 2933/0041; H01L 33/50; H01L 33/0025; H01L 33/007; H01L 33/08; H01L 33/46; H01L 33/502
USPC ............................................. 257/94, 201, 749
See application file for complete search history.

(56) References Cited

U.S. PATENT DOCUMENTS

| | | | |
|---|---|---|---|
| 5,917,202 | A | 6/1999 | Haitz et al. |
| 6,969,874 | B1 | 11/2005 | Gee et al. |
| 6,992,334 | B1 | 1/2006 | Wierer, Jr. et al. |

(Continued)

FOREIGN PATENT DOCUMENTS

| | | |
|---|---|---|
| EP | 1168460 A2 | 1/2002 |
| EP | 1530242 A2 | 5/2005 |
| WO | 2011006995 | 1/2011 |

OTHER PUBLICATIONS

Park, International Search Report and Written Opinion for International Application No. PCT/US2012/069056, Mar. 28, 2013, 14 pages.

(Continued)

*Primary Examiner* — Thanh T Nguyen
(74) *Attorney, Agent, or Firm* — LaBatt, LLC

(57) ABSTRACT

A contact including an ohmic layer and a reflective layer located on the ohmic layer is provided. The ohmic layer is transparent to radiation having a target wavelength, while the reflective layer is at least approximately eighty percent reflective of radiation having the target wavelength. The target wavelength can be ultraviolet light, e.g., having a wavelength within a range of wavelengths between approximately 260 and approximately 360 nanometers.

21 Claims, 6 Drawing Sheets

(51) Int. Cl.
H01L 33/42 (2010.01)
H01L 33/40 (2010.01)

(56) References Cited

U.S. PATENT DOCUMENTS

| | | | |
|---|---|---|---|
| 7,193,249 B2 | 3/2007 | Seong et al. | |
| 7,262,436 B2 | 8/2007 | Kondoh et al. | |
| 7,319,247 B2 | 1/2008 | Bader et al. | |
| 7,335,924 B2 | 2/2008 | Liu et al. | |
| 7,355,212 B2 | 4/2008 | Okazaki et al. | |
| 7,485,479 B2 | 2/2009 | Seong et al. | |
| 7,501,295 B2 | 3/2009 | Zhou | |
| 7,611,915 B2 | 11/2009 | Slater, Jr. et al. | |
| 7,612,384 B2 | 11/2009 | Zhou | |
| 7,687,822 B2 | 3/2010 | Nagai et al. | |
| 7,691,659 B2 | 4/2010 | Bader et al. | |
| 7,714,340 B2 | 5/2010 | Chua et al. | |
| 7,829,359 B2 | 11/2010 | Tang et al. | |
| 7,872,272 B2 | 1/2011 | Bour et al. | |
| 7,915,624 B2 | 3/2011 | Jorgenson | |
| 7,973,325 B2 | 7/2011 | Kim et al. | |
| 7,985,979 B2 | 7/2011 | David et al. | |
| 2003/0209720 A1* | 11/2003 | Okazaki et al. | 257/98 |
| 2006/0071226 A1 | 4/2006 | Kojima et al. | |
| 2006/0186552 A1 | 8/2006 | Venugopalan | |
| 2007/0161137 A1* | 7/2007 | Slater et al. | 438/29 |
| 2008/0144688 A1 | 6/2008 | Chua et al. | |
| 2009/0134419 A1 | 5/2009 | Zhou | |
| 2010/0264440 A1* | 10/2010 | Park | 257/98 |
| 2012/0146047 A1 | 6/2012 | Kneissl et al. | |

OTHER PUBLICATIONS

Rideout, V., "A review of the theory and technology for ohmic contacts to group III-V compound semiconductors," Solid-State Electronics, Jun. 1975, pp. 541-550, vol. 18, Pergamon Press.
Chen et al., "High-reflectivity Pd/Ni/Al/Ti/Au ohmic contacts to p-type GaN for ultraviolet light-emitting diodes," Applied Physics Letters, Oct. 2004, pp. 2797-2799, vol. 85, No. 14, American Institute of Physics.
Jang et al., "Low-resistance and thermally stable ohmic contact on p-type GaN using Pd/Ni metallization," Applied Physics Letters, Sep. 2001, pp. 1822-1824, vol. 79, No. 12, American Institute of Physics.
Zhou, L. et al., "Low resistance Ti/Pt/Au ohmic contacts to p-type GaN," Applied Physics Letters, Jun. 2000, pp. 3451-3453, vol. 76, No. 23, American Institute of Physics.
Song et el., "High-quality nonalloyed rhodium-based ohmic contacts to p-type GaN," Applied Physics Letters, Sep. 2003, pp. 2372-2374, vol. 83, No. 12, American Institute of Physics.
Jang et al., "Low-resistance Pt/Ni/Au ohmic contacts to p-type GaN," Applied Physics Letters, Jan. 1999, pp. 70-72, vol. 74, No. 1, American Institute of Physics.
Jang et al., "Ohmic contacts to p-type GaN using a Ni/Pt/Au metallization scheme," Journal of Vacuum Science & Technology B: Microelectronics and Nanometer Structures, 1998, pp. 3105-3107, vol. 16, No. 6, American Vacuum Society.
Fung et al., "A study of the electrical characteristics of various metals on p-type GaN for ohmic contacts," Journal of Electronic Materials, 1999, pp. 572-579, vol. 28, No. 5.
Chu et al., "Low-resistance ohmic contacts on p-type GaN using Ni/Pd/Au metallization," Applied Physics Letters, Nov. 2000, pp. 3423-3425, vol. 77, No. 21, American Institute of Physics.
Kim et al., "Low resistance contacts to p-type GaN," Mater. Res. Soc. Symp. Proc., 1997, pp. 427-430, vol. 468, Materials Research Society.
Yamada et al., "InGaN-Based Near-Ultraviolet and Blue-Light-Emitting Diodes with High External Quantum Efficiency Using a Patterned Sapphire Substrate and a Mesh Electrode," Japanese Journal of Applied Physics, Dec. 2002, pp. L1431-L1433, vol. 41, No. 12B, Part 2, The Japan Society of Applied Physics.
Tamura et al., "InGaN-based light-emitting diodes fabricated with transparent Ga-doped ZnO as ohmic p-contact," phys. stat. sol. (a) 201, Sep. 2004 pp. 2704-2707, No. 12, WILEY-VCH Verlag GmbH & Co. KGaA, Weinheim.
Sun et al., "p-GaN surface treatments for metal contacts," Applied Physics Letters Jan. 2000, pp. 415-417, vol. 76, No. 4, American Institute of Physics.
Song et al., "Domain Matching Epitaxy of Mg-Containing Ag Contact on p-Type GaN," Crystal Growth & Design 11, 2011, pp. 2559-2563, No. 6, American Chemical Society.
Song et al., "Effects of Mg Additive on Inhibition of Ag Agglomeration in Ag-Based Ohmic Contacts on p-GaN," Electrochemical and Solid-State Letters 13, Mar. 2010, pp. H173-H175, No. 6, The Electrochemical Society.
Song et al., "Highly transparent Ag/SnO2 ohmic contact to p-type GaN for ultraviolet light-emitting diodes," Applied Physics Letters, Dec. 2004, pp. 6374-6376, vol. 85, No. 26, American Institute of Physics.
Song et al., "Highly low resistance and transparent Ni/ZnO ohmic contacts to p-type GaN," Applied Physics Letters, Jul. 2003, pp. 479-481, vol. 83, No. 3, American Institute of Physics.
Song et al., "Ohmic-Contact Technology for GaN-Based Light-Emitting Diodes: Role of P-Type Contact," IEEE Transactions on Electron Devices, Jan. 2010, pp. 42-59, vol. 57, No. 1, IEEE.
Song et al., "Low Resistance and Reflective Mg-Doped Indium Oxide—Ag Ohmic Contacts for Flip-Chip Light-Emitting Diodes," IEEE Photonics Technology Letters, Jun. 2004, pp. 1450-1452, vol. 16, No. 6, IEEE.
Song et al., "Improvement of the electrical performance of near UV GaN-based light-emitting diodes using Ni nanodots," Solid-State Electronics 49, 2005, pp. 1986-1989, No. 12, Elsevier Ltd.
Song et al., "Effect of Pt and Ti on Ni/Ag/(Pt or Ti)/Au p-ohmic contacts of GaN based flip-chip LEDs," Applied Surface Science 257, 2011, pp. 8102-8105, No. 18, Elsevier B.V.
Sohn et al., "Formation of Nonalloyed Low Resistance Ni/Au Ohmic Contacts to p-Type GaN Using Au Nanodots," Electrochemical and Solid-State Letters 7, 2004, pp. G179-G181, No. 9, The Electrochemical Society, Inc.
Pan et al., "Enhanced output power of InGaN—GaN light-emitting diodes with high-transparency nickel—oxide—indium—tin—oxide ohmic contacts," IEEE Photonics Technology Letters, May 2003, pp. 646-648, vol. 15, No. 5, IEEE.
Park et al., "Thermally Stable and Reflective RhZn/Ag Ohmic Contacts to p-type GaN for Near-UV Flip-chip Light-emitting Diodes," Journal of the Korean Physical Society 59, Jul. 2011, pp. 156-160, vol. 59, No. 1.
Nakahara et al., "Improved External Efficiency InGaN-Based Light-Emitting Diodes with Transparent Conductive Ga-Doped ZnO as p-Electrodes," Japanese Journal of Applied Physics, Jan. 2004, pp. L180-L182, vol. 43, No. 2A, The Japan Society of Applied Physics.
Margalith et al., "Indium tin oxide contacts to gallium nitride optoelectronic devices," Applied Physics Letters, Jun. 1999, pp. 3930-3932, vol. 74, No. 26, American Institute of Physics.
Lin et al., "Nitride-based light-emitting diodes with Ni/ITO p-type ohmic contacts," IEEE Photonics Technology Letters, Dec. 2002, pp. 1668-1670, vol. 14, No. 12, IEEE.
Leem et al., "Formation of High-Quality Ohmic Contacts to p-GaN for Flip-Chip LEDs Using Ag/TiN[sub x]/Al," Electrochemical and Solid-State Letters 8, 2005, pp. G150-G152, No. 6, The Electrochemical Society.
Kim et al., "Highly Reflective and Low-Resistant Ni/Au/ITO/Ag Ohmic Contact on p-Type GaN," Electrochemical and Solid-State Letters 7, 2004, pp. G102-G104, No. 5, The Electrochemical Society.
Kim et al., "Performance characteristics of GaN-based light-emitting diodes fabricated with AgNi, AgCu, and AgAl-alloy reflectors," Journal of Vacuum Science and Technology B: Microelectronics and Nanometer Structures 29, 2011, pp. 011032-1-011032-5, No. 1, American Vacuum Society.
Kim et al., "Low-resistance and highly transparent Ag/IZO ohmic contact to p-type GaN," Thin Solid Films 517, 2009, pp. 4039-4042, No. 14, Elsevier B.V.
Jung et al., "Improved Light Output of GaN-Based Light-Emitting Diodes by Using AgNi Reflective Contacts," Journal of Electronic Materials, Sep. 2011, pp. 2173-2178, vol. 40, No. 11, TMS.

(56) References Cited

OTHER PUBLICATIONS

Jang et al., "The role of reflective p-contacts in the enhancement of light extraction in nanotextured vertical InGaN light-emitting diodes," Nanotechnology 21, Jan. 2010, pp. 1-5 025203, IOP Publishing Ltd.

Jang et al., "Mechanisms for the reduction of the Schottky barrier heights of high-quality nonalloyed Pt contacts on surface-treated p-GaN," Journal of Applied Physics, Sep. 2000, pp. 3064-3066, vol. 88, No. 5, American Institute of Physics.

Jang et al., "Highly reflective low resistance Ag-based Ohmic contacts on p-type GaN using Mg overlayer," Applied Physics Letters 90, 2007, pp. 012106-1-012106-3, American Institute of Physics.

Jang et al., "Formation of High-Quality Ag-Based Ohmic Contacts to p-Type GaN," Journal of the Electrochemical Society 155, 2008, pp. H563-H568, No. 8, The Electrochemical Society.

Jang et al., "Mechanism for ohmic contact formation of Ni/Ag contacts on p-type GaN," Applied Physics Letters, Dec. 2004, pp. 5920-5922, vol. 85, No. 24, American Institute of Physics.

Hwang et al., "Electrical and thermal stability of Ag ohmic contacts for GaN-based flip-chip light-emitting diodes by using an AgAl alloy capping layer," Materials Science in Semiconductor Processing 10, Feb. 2007, pp. 14-18, Elsevier Ltd.

Horng et al., "Low-resistance and high-transparency Ni/indium tin oxide ohmic contacts to p-type GaN," Applied Physics Letters, Oct. 2001, pp. 2925-2927, vol. 79, No. 18, American Institute of Physics.

Hong-Xia et al., "A Novel Ni/Ag/Pt Ohmic Contact to P-Type GaN for Flip-Chip Light-Emitting Diodes," Chinese Physics Letters, Aug. 2006, pp. 2299-2302, vol. 23, No. 8, Chinese Physical Society and IOP Publishing Ltd.

Kim et al., "High-reflectivity Al-Pt nanostructured Ohmic contact to p-GaN," IEEE Transactions on Electron Devices, Oct. 2006, pp. 2448-2453, vol. 53, No. 10, IEEE.

Hibbard et al., "Low resistance high reflectance contacts to p-GaN using oxidized Ni/Au and Al or Ag," Applied Physics Letters, Jul. 2003, pp. 311-313, vol. 83, No. 2, American Institute of Physics.

Hagio et al., "Interface Properties between Ni and p-GaN Studied by Photoemission Spectroscopy," Japanese Journal of Applied Physics, Apr. 2002, pp. 2493-2496, vol. 41, Part 1, No. 4B, The Japan Society of Applied Physics.

Chou et al., "High thermally stable Ni/Ag(Al) alloy contacts on p-GaN," Applied Physics Letters 90, 2007, pp. 022103-1-022103-3, No. 2, American Institute of Physics.

Chen et al., "Highly Reflective Ag/La Bilayer Ohmic Contacts to p-Type GaN," Journal of the Electrochemical Society 158, 2011, pp. H285-H288, No. 3, The Electrochemical Society.

Chang et al., "High reflective p-GaN/Ni/Ag/Ti/Au Ohmic contacts for flip-chip light-emitting diode (FCLED) applications," Applied Surface Science 255, Apr. 2009, pp. 6155-6158, No. 12, Elsevier B.V.

Ban et al., "Use of an indium zinc oxide interlayer for forming Ag-based Ohmic contacts to p-type GaN for UV-light-emitting diodes," Semiconductor Science and Technology 20, Sep. 2005, pp. 921-924, No. 9, IOP Publishing Ltd.

Ban et al., "Ir/Ag reflector for high-performance GaN-based near UV light emitting diodes," Materials Science and Engineering B 133, Aug. 2006, pp. 26-29, Elsevier B.V.

Jung et al., "Improved electrical and thermal properties of Ag contacts for GaN-based flip-chip light-emitting diodes by using a NiZn alloy capping layer," Superlattices and Microstructures 46, Oct. 2009, pp. 578-584, No. 4, Elsevier Ltd.

Wang et al., "Improved light output of GaN-based vertical light emitting diodes using SiO2 nanotube arrays and transparent metal oxide current conduction layer," Applied Physics Letters 99, 2011, 131111-1-131111-3, American Institute of Physics.

Heising, S., Application No. EP 12858068, "Supplementary European Search Report," Jun. 29, 2015, 9 pages.

\* cited by examiner

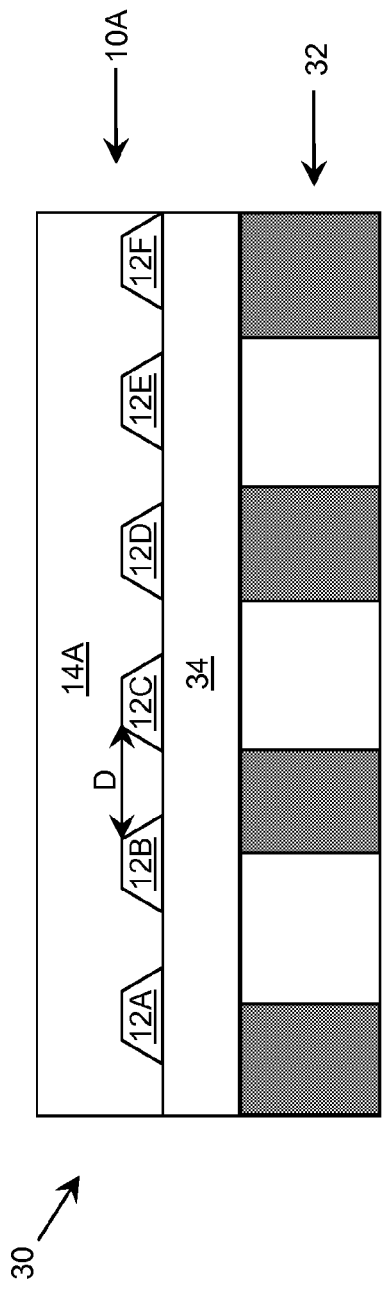
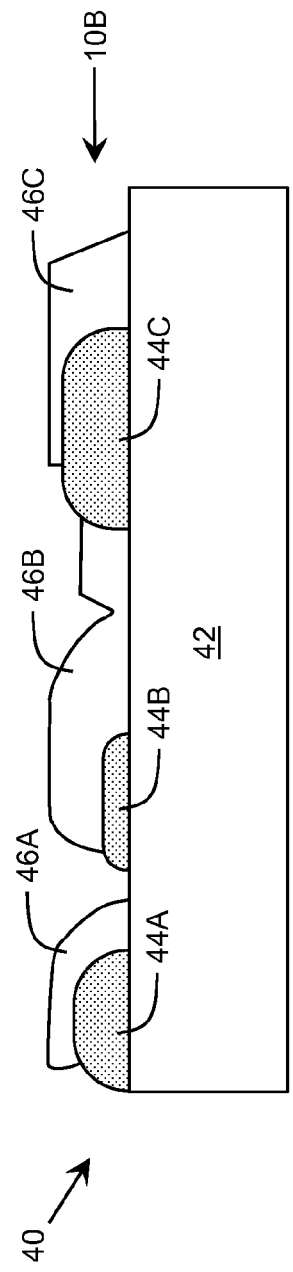

000
ULTRAVIOLET REFLECTIVE CONTACT

REFERENCE TO RELATED APPLICATIONS

The current application claims the benefit of U.S. Provisional Application No. 61/569,416, titled "Ultraviolet Reflective Contact," which was filed on 12 Dec. 2011, and which is hereby incorporated by reference.

GOVERNMENT LICENSE RIGHTS

This invention was made with government support under contract no. W911NF-10-2-0023 awarded by the Defense Advanced Research Projects Agency (DARPA). The government has certain rights in the invention.

TECHNICAL FIELD

The disclosure relates generally to contacts for semiconductor devices, and more particularly, to an ultraviolet reflective contact.

BACKGROUND ART

Group III nitride-based semiconductors are widely used for efficient blue and ultraviolet light emitting diodes, lasers, ultraviolet detectors, and field effect transistors. Due to a wide band-gap, group III nitride semiconductor materials are one of the prime choices for deep ultraviolet light emitting diodes (DUV LEDs). While significant improvements in efficiency have been made for DUV LEDs in recent years, the overall efficiencies of these devices remains low. For example, the wide band-gap of the group III nitride semiconductor materials makes it difficult to form a good ohmic contact to the semiconductor layers, which leads to resistive losses at the contact junction.

DUV LED devices frequently employ flip-chip technology to control light extraction and thermal management of the DUV LED devices. For example, FIG. 1 shows a typical design of a flip-chip LED 2 according to the prior art. In this design, most of the light generated in the active region 4 is extracted through a transparent substrate. Efficiency of the flip-chip LED 2 is heavily dependent on the transparent properties of the semiconductor layers. However, for the flip-chip LED 2 to have a high efficiency, it also is desirable for each of the p-type contact 6 and the n-type contact 8 to be both ohmic and reflective, thereby allowing each contact 6, 8 to serve as an electrode as well as a mirror for reflecting light emitted by the active region 4. Additionally, the contacts 6, 8 should have stability during thermal cycling while packaging, as well as during operation of the device. Aluminum is a good reflecting metal, however, it does not produce an ohmic contact and is unstable during packaging.

Several types of metallic contacts have been proposed to improve ohmic contact to semiconductor layers. These contacts are formed of, for example: nickel/gold (Ni/Au), cobalt/gold (Co/Au), palladium/gold (Pd/Au), rhodium (Rh)-based, palladium/platinum/gold (Pd/Pt/Au), Pt/Ni/Au, Ni/Pt/Au, Ni/Pd/Au, and titanium/platinum/gold (Ti/Pt/Au) metallic layers. The thermal stability of Pd/Ni contacts is enhanced due to the formation of Pd gallides. Additionally, Pd/Ni contacts can lead to a reduction of contact resistivity. For Ni-based contacts, the Ni is easily oxidized above 400 degrees Celsius and the ohmic contact becomes worse at temperatures above 500 degrees Celsius.

One approach proposed a Pd/Ni/Al/Ti/Au metallization scheme for a contact, with the layers having corresponding thicknesses of 3 nanometers (nm)/2 nm/150 nm/20 nm/30 nm. The contact exhibited good thermal stability, reflectivity of sixty-two percent for radiation having a wavelength of 370 nm at normal incidence, and good ohmic characteristics after annealing at three hundred degrees Celsius in nitrogen gas ($N_2$). It is further noted that the combination of Pd and Ni results in a good ohmic contact, while a contact without Ni results in a larger resistance and non-linear behavior. Another approach removes residual oxide from a gallium nitride (GaN) surface using Ni deposition to achieve better ohmic contact properties.

To date, most contact engineering has been for visible LEDs or near ultraviolet (UV) LEDs. For example, one approach found good ohmic properties for an iridium/silver (Ir/Ag) p-type contact with a seventy-five percent reflectivity for radiation having a wavelength of 405 nm. For the same radiation wavelength, an indium-doped zinc oxide/silver (ZnO/Ag) contact had a reflectivity of 82.3%. These are only illustrative of many contact schemes proposed for radiation in the near UV wavelength. Indium tin oxide (ITO) and ZnO contact also have been proposed for LEDs operated at near UV or UVA wavelengths. However, for UV LEDs different contacts are required in order to provide highly reflective UV mirrors.

To lower resistance of a Schottky barrier, a difference between the work function of the metal and the semiconductor can be reduced. Unfortunately, for group III nitride semiconductors, the band gap is large and the resulting work function for the p-type semiconductors is large as well. It is understood that not only the work function of an aluminum gallium nitride (AlGaN) and metallic contact determines the behavior of the Schottky junction for a p-type semiconductor. The presence of high density surface states for covalent semiconductors pins the Fermi level at the interface. Regardless, it has been observed that the ohmic contact is sensitive to the metal work function. For example, aluminum, with a low work function of approximately four electron volts (eV) does not result in an ohmic contact. However, Pd and Ni, each with a work function above five eV form better ohmic contacts to semiconductor materials.

An approach describes a reflective electrode for a semiconductor light emitting device as including an ohmic contact layer formed of Ag or an Ag-alloy, which forms an ohmic contact with a p-type compound semiconductor layer. The Ag-alloy can be an alloy of Ag and a group of materials, such as magnesium (Mg), Zn, scandium (Sc), hafnium (Hf), zirconium (Zr), tellurium (Te), selenium (Se), tantalum (Ta), tungsten (W), niobium (Nb), copper (Cu), silicon (Si), Ni, Co, molybdenum (Mo), chromium (Cr), manganese (Mn), mercury (Hg), and praseodymium (Pr). The contact can include a layer composed of Ni or an Ni-alloy, which can have a thickness in the range between 0.1 and 500 nm. The contact also includes a layer located on the ohmic contact layer or the Ni layer, which is formed of a material selected from: Ni, Ni-alloy, Zn, Zn-alloy, Cu, Cu-alloy, ruthenium (Ru), Ir, and Rh, and a subsequent layer formed of a light reflective material. The reflective material can be Ag, Ag-alloy, Al, Al-alloy, or Rh, and have a thickness between 10 to 5000 nm. The electrode can further include another layer on the light reflective material to prevent an agglomeration phenomenon during the annealing process, which can occur on the surface of the reflective material without the additional layer being present. The layer can be formed of a material selected from: Cu, Cu/Ru, Cu/Ir, Cu-alloy, Cu-alloy/Ru and Cu-alloy/Ir.

SUMMARY OF THE INVENTION

The inventors have found that the above-described contacts, while they may be optimal for near UV and UVA LEDs, the contact to a p-type group III semiconductor for a DUV LED can be improved in order to achieve a higher efficiency in the UV emission range.

Aspects of the invention provide a contact including an ohmic layer and a reflective layer located on the ohmic layer. The ohmic layer is transparent to radiation having a target wavelength, while the reflective layer is at least approximately eighty percent reflective of radiation having the target wavelength. The target wavelength can be ultraviolet light, e.g., having a wavelength within a range of wavelengths between approximately 260 and approximately 360 nanometers.

A first aspect of the invention provides a contact comprising: an ohmic layer, wherein the ohmic layer is transparent to radiation having a target wavelength; and a reflective layer located on the ohmic layer, wherein the reflective layer is at least approximately eighty percent reflective of radiation having the target wavelength, and wherein the target wavelength is within a range of wavelengths between approximately 260 and approximately 360 nanometers.

A second aspect of the invention provides a device comprising: a first semiconductor layer; and a contact to the first semiconductor layer, wherein the contact includes: an ohmic layer, wherein the ohmic layer is transparent to radiation having a target wavelength; and a reflective layer located on the ohmic layer, wherein the reflective layer is at least approximately eighty percent reflective of radiation having the target wavelength, and wherein the target wavelength is within a range of wavelengths between approximately 260 and approximately 360 nanometers.

A third aspect of the invention provides a device comprising: a first group III nitride semiconductor layer; a second group III nitride semiconductor layer located on the first semiconductor layer, wherein the second semiconductor layer has a band gap narrower than a band gap of the first semiconductor layer, and wherein the second semiconductor layer has a thickness less than approximately fifty nanometers; and a contact located on the second semiconductor layer, wherein the contact includes: an ohmic layer, wherein the ohmic layer is transparent to radiation having a target wavelength; and a reflective layer located on the ohmic layer, wherein the reflective layer is at least approximately eighty percent reflective of radiation having the target wavelength, and wherein the target wavelength is within a range of wavelengths between approximately 260 and approximately 360 nanometers.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 5 shows a portion of an illustrative device structure according to an embodiment.

FIG. 6 shows a portion of an illustrative device structure according to another embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a contact including an ohmic layer and a reflective layer located on the ohmic layer. The ohmic layer is transparent to radiation having a target wavelength, while the reflective layer is at least approximately eighty percent reflective of radiation having the target wavelength. The target wavelength can be ultraviolet light, e.g., having a wavelength within a range of wavelengths between approximately 260 and approximately 360 nanometers. As used herein, unless otherwise noted, the term "set" means one or more (i.e., at least one) and the phrase "any solution" means any now known or later developed solution.

Figure 1:
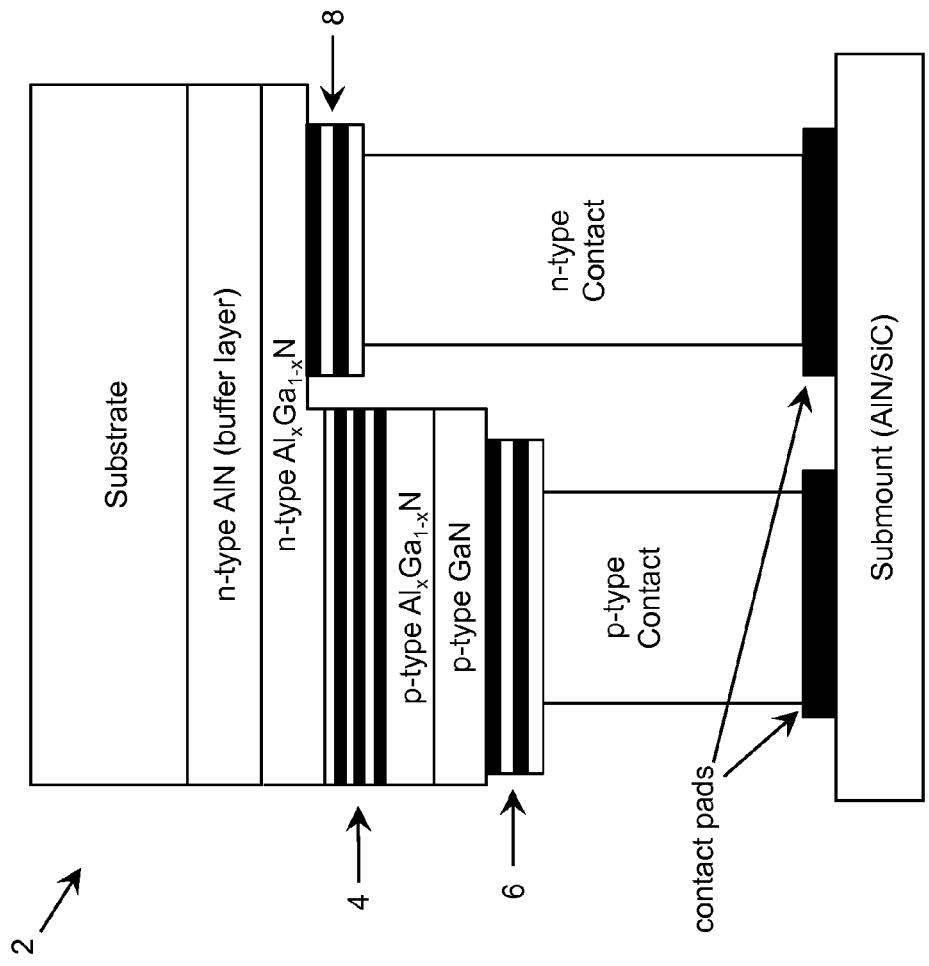
FIG. 1 shows a typical design of a flip-chip LED according to the prior art.

Furthermore, it is understood that a contact formed between two layers is considered "ohmic" or "conducting" when an overall resistance of the contact is no larger than the larger of the following two resistances: a contact resistance such that a voltage drop at the contact-semiconductor junction is no larger than two volts; and a contact resistance at least five times smaller than a resistance of a largest resistive element or layer of a device including the contact. In an embodiment, the largest resistive element is an active region of the corresponding device (e.g., a resistance of the active region 4 of the LED shown in FIG. 1). As used herein, a layer/material is considered "transparent" if it allows at least approximately ten percent of electromagnetic radiation in a corresponding range of radiation wavelengths to pass there through. Similarly, a layer/material is considered "reflective" if it reflects at least approximately ten percent of electromagnetic radiation in a corresponding range of radiation wavelengths.

Figure 2:
FIG. 2 shows an illustrative multi-layer contact according to an embodiment.

Turning to the drawings, FIG. 2 shows an illustrative multi-layer contact 10 according to an embodiment. The contact 10 can be implemented as a p-type or n-type contact for a semiconductor device. In an embodiment, the contact 10 is implemented on a light emitting device, such as a conventional or super luminescent light emitting diode (LED). Alternatively, the emitting device can be configured to operate as a laser diode (LD). For example, the contact 10 can be formed on a flip-chip LED, which is configured similar to the LED 2 (FIG. 1), e.g., in place of one or both of the contacts 6, 8 shown thereon. However, it is understood that a flip-chip LED is only illustrative of various types of semiconductor devices for which one or more of the contacts 10 can be utilized.

While aspects of the invention are generally shown and described herein with respect to improving extraction of light from an emitting device, it is understood that aspects of the invention further provide various alternative embodiments. For example, aspects of the invention can be implemented to facilitate the transmission of light within the device, e.g., as part of optical pumping of a laser light generating structure, excitation of a carrier gas using a laser pulse, and/or the like.

Similarly, an embodiment of the invention can be implemented in conjunction with a sensing device, such as a photosensor or a photodetector. In each case, a contact described herein can be included in order to facilitate the reflection of light in a desired direction.

The electromagnetic radiation emitted or sensed by a device including a contact described herein can comprise a peak wavelength within any range of wavelengths, including visible light, ultraviolet radiation, infrared light, and/or the like. In an embodiment, the device is configured to generate and/or sense radiation having a peak wavelength in the ultraviolet spectrum (e.g., an ultraviolet device). In a more particular embodiment, the ultraviolet device is configured to emit and/or detect radiation having a peak wavelength in the deep ultraviolet radiation spectrum.

In an embodiment, the emitting or sensing device is a group III-V materials based device, in which some or all of the various layers are formed of elements selected from the group III-V materials system. In a more particular illustrative embodiment, the various layers of the device are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

In any event, the contact 10 can include an ohmic layer 12, which is located on a surface of a semiconductor layer of a device heterostructure. The ohmic layer 12 can be formed of any type of material, which makes a good ohmic contact to the semiconductor layer on which the contact 10 is located. Furthermore, when implemented on an ultraviolet device, the ohmic layer 12 can be transparent (transmissive) to ultraviolet radiation having a target wavelength. For example, the ohmic layer 12 can be approximately eighty percent or more ultraviolet transmitting. In an embodiment, the ohmic layer 12 is formed of two or more metal sub-layers, which can have an abrupt interface during deposition. In an embodiment, the sub-layers of the ohmic layer 12 are partially alloyed. One or more of the metals can be, for example: cobalt (Co), nickel (Ni), palladium (Pd), iron (Fe), and platinum (Pt). Additionally, one or more of the metals can be: Pd, rhodium (Rh), ruthenium (Ru), osmium (Os), iridium (Ir), thorium (Th), and boron (B), which can incorporate one or more of: calcium (Ca), magnesium (Mg), beryllium (Be), manganese (Mn), or tin (Sn), with a maximum concentration up to approximately $10^{21}$ cm$^{-3}$. For example, the ohmic layer 12 can include: a sub-layer of Co/Mg/Ni having a thickness of approximately one to two nanometers, which can act as an adhesive; a two to five nanometer sub-layer of palladium, which can provide a good ohmic contact; and a sub-layer of rhodium having a thickness of approximately 150 Angstroms.

Figure 3A:
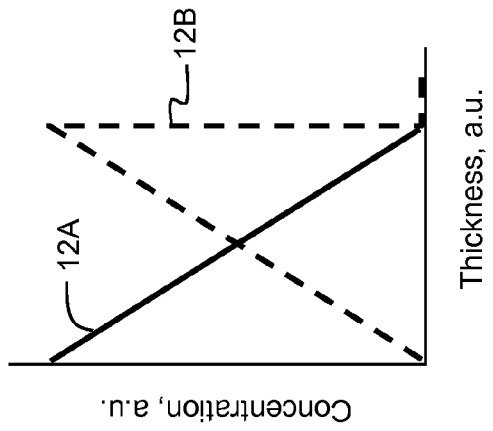
FIGS. 3A and 3B show schematics of a concentration of two metals before and after annealing, respectively, according to an embodiment.
Figure 3B:
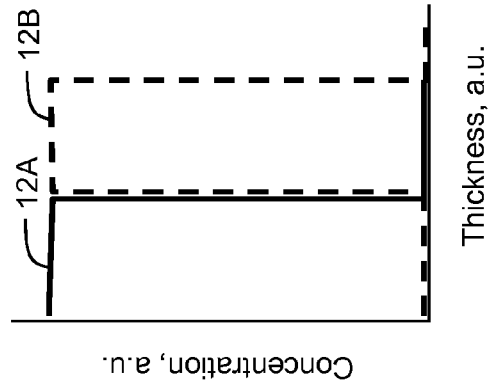

In an embodiment, the ohmic layer 12 can be annealed after formation (e.g., deposition) of the two or more metal layers. The annealing can form a graded ohmic layer 12 having a delta composition profile. To this extent, FIGS. 3A and 3B show schematics of a concentration of a first metal 12A and a second metal 12B forming an ohmic layer 12 (FIG. 2) before and after annealing, respectively, according to an embodiment. As illustrated in FIG. 3A, after the formation of the metal layers and prior to annealing, a sharp interface is present between the two metals 12A, 12B. However, after annealing as shown in FIG. 3B, the relative concentration between the two metals 12A, 12B in the ohmic layer 12 forms a delta concentration profile. Similarly, the delta composition profile can be formed by co-deposition of the metals or deposition of graded thin layers, e.g., using thermal evaporation, e-beam deposition, magnetron sputtering, evaporation by laser beam, and/or the like. The formation also can include annealing in nitrogen, argon, oxygen, or the like, containing ambient at a temperature of 450-800 degrees Celsius.

Returning to FIG. 2, the contact 10 also is shown including an ohmic protective layer 14, which is located directly on the ohmic layer 12. The ohmic protective layer 14 can comprise any type of material and have a minimum thickness to prevent diffusion of a subsequent layer, such as a reflective layer 16 into the ohmic layer 12. In an embodiment, the ohmic protective layer 14 is a metallic layer having a thickness on the order of a few tens of nanometers. Furthermore, the ohmic protective layer 14 can have a high reflectivity of ultraviolet radiation having a target wavelength. In an embodiment, the ohmic protective layer 14 has a reflectivity of at least approximately sixty percent of ultraviolet radiation having the target wavelength. In a more particular embodiment, the ohmic protective layer is formed of rhodium. However, it is understood that this is only illustrative. To this extent, the ohmic protective layer 14 can be formed of: a metal such as: Pt, rhenium (Re), Pd, Rh, Ru, Os, Ir, or the like; an oxide, such as indium tin oxide (ITO), zinc oxide (ZnO), or the like; and/or the like.

In an embodiment, the ohmic protective layer 14 is sufficiently thin such that at least a portion of the ultraviolet radiation is transmitted there through. As a result, the ohmic protective layer 14 can be semi-transparent and semi-reflective of ultraviolet radiation having a target wavelength. To this extent, the contact 10 can include a reflective layer 16 located directly on the ohmic protective layer 14. The reflective layer 16 can be formed of any type of material that is reflective of radiation, such as ultraviolet radiation, having a target wavelength, and have a sufficient thickness to reflect a minimum target amount of the radiation. In an embodiment, the reflective layer 16 is formed of a material that is at least approximately eighty percent reflective of ultraviolet radiation having a target wavelength. In a more particular embodiment, the ohmic protective layer is formed of aluminum (Al). However, it is understood that this is only illustrative. To this extent, the reflective layer 16 can be formed of: Mg, Al, Be, B, scandium (Sc), Rh, Ir, Os, Pt, Pd, Re, or their alloys, such as an Al/Be alloy, an Al/Mg alloy, and/or the like.

Additionally, the contact 10 can include a reflector protective layer 18, which is located directly on the reflective layer 16. The reflector protective layer 18 can comprise any type of material and have a minimum thickness to prevent intermixing between the reflective layer 16 and a subsequent layer, such as a conductive layer 20. The reflector protective layer 18 can be formed of any suitable material, such as: titanium (Ti), zirconium (Zr), hafnium (Hf), molybdenum (Mo), tungsten (W), Pd, Rh, Ru, Os, Ir, vanadium (V), chromium (Cr), Pt, or their alloys.

The conductive layer 20 can be located directly on the reflector protective layer 18, and can comprise a layer of any type of material having a high electrical conductivity (e.g., a conductivity of at least $10^6$ Siemens per meter (S/m) at operational temperatures of the corresponding device). Additionally, the conductive layer 20 can have a high thermal conductivity. For example, the conductive layer 20 can be a thick metal layer having a low hardness. Illustrative metals for the conductive layer 20 include: copper (Cu), silver (Ag), gold (Au), nickel (Ni), or their alloys. In an embodiment, the conductive layer 20 comprises gold.

The contact 10 also can include a dielectric adhesion layer 22 located directly on the conductive layer 20. The dielectric adhesion layer 22 can comprise a layer of any type of material, which can promote adhesion of an insulating dielectric film (e.g., silicon dioxide) to the contact 10. The insulating dielectric film can be deposited, for example, on one or more regions of a contact pad area (e.g., when the contact 10 is implemented as part of a flip-chip device. In an embodiment, the dielectric adhesion layer 22 is a thin (e.g., approximately 300 angstroms) layer of a metal, such as Ti, Ni, Zr, Pd, and/or the like. In an embodiment, the dielectric adhesion layer 22 has a thickness of at least approximately one hundred angstroms. The insulating dielectric film subsequently can be formed on a portion of a top surface of the dielectric adhesion layer 22 using any solution (e.g., deposition).

The various layers of the contact 10 can be formed using any solution. For example, a layer of the contact 10 can be formed using thermal evaporation, e-beam deposition, magnetron sputtering, evaporation by laser beam, and/or the like. In embodiment, a semiconductor structure is obtained (e.g., grown) and the location(s) for one or more contacts to be located on a surface of the structure is (are) identified. A photoresist can be placed on the surface and can include openings at the identified location(s). Subsequently, the ohmic layer 12, and the ohmic protective layer 14 can be formed in the openings using any solution (e.g., by growing the layers 12, 14 using e-beam deposition followed by subsequent removal of the photoresist using acetone or the like). The layers 12, 14 can undergo a rapid thermal annealing (e.g., heating the structure to 600 degrees Celsius and subsequently cooling the structure at rates of approximately eight degrees Celsius per second) while the structure is located within a chamber filled with an inert gas. Subsequently, the remaining layers, such as the reflective layer 16, the reflector protective layer 18, the conductive layer 20, and the dielectric adhesion layer 22 can be formed using any solution (e.g., using a photoresist and subsequent growth or the like).

Figure 4:
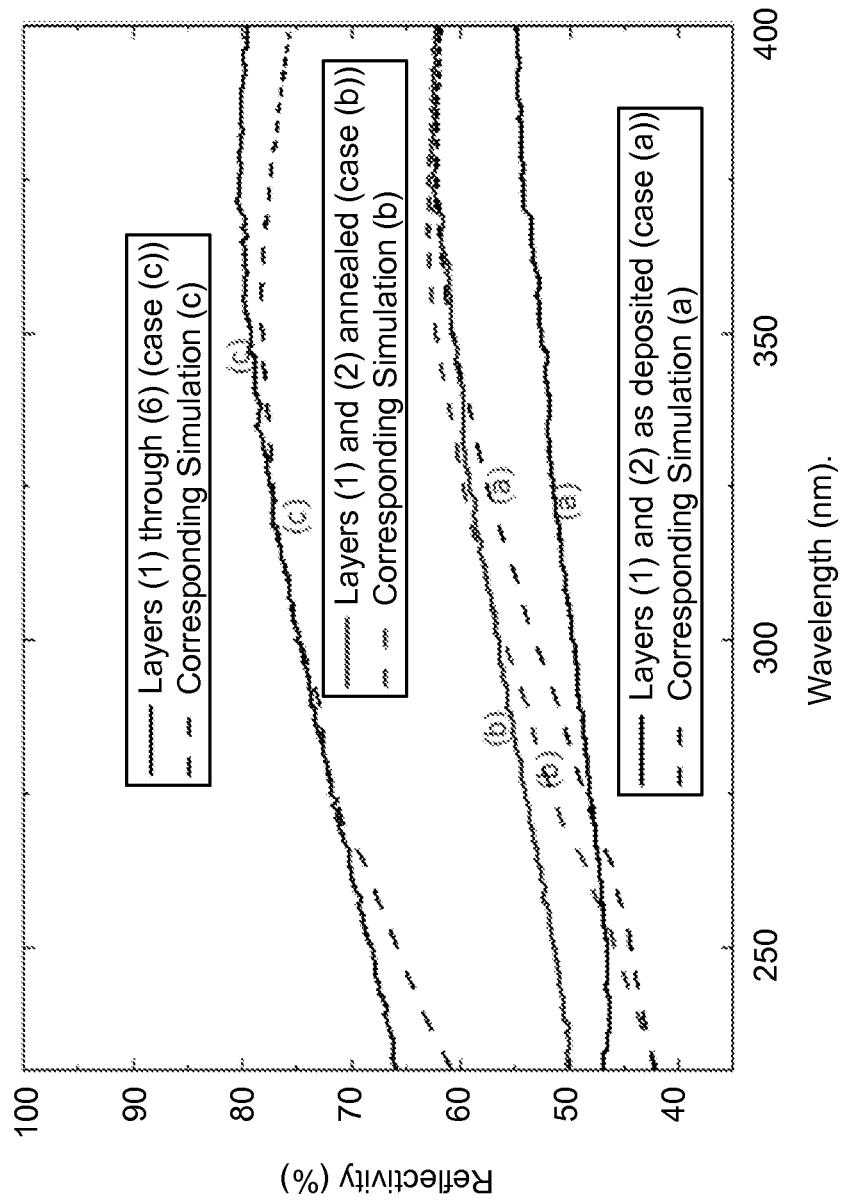
FIG. 4 shows simulated and measured reflective coefficients of illustrative contact configurations according to an embodiment.

As discussed herein, the contact 10 can be configured to be reflective of radiation having a target wavelength. To this extent, illustrative contact configurations described herein were simulated and measured for their reflectivity. FIG. 4 shows simulated and measured reflective coefficients of illustrative contact configurations according to an embodiment. In a first configuration (case (a)), a reflectivity for a contact including an ohmic layer 12 and an ohmic protective layer 14 was simulated and measured over a range of radiation wavelengths between approximately 240 nanometers and 400 nanometers. In a second configuration (case (b)), a reflectivity for a contact including an ohmic layer 12 and an ohmic protective layer 14, which have been annealed, was simulated and measured over the same range of radiation wavelengths. Finally, in a third configuration (case (c)), a reflectivity for a contact including all six layers shown in FIG. 2 (with layers 12 and 14 annealed), was simulated and measured over the same range of radiation wavelengths.

As illustrated, each contact configuration (cases a-c), has a reflectivity (e.g., as measured for a vacuum-to-contact interface) of at least approximately forty-five percent for radiation having a wavelength in the ultraviolet spectral range between approximately 260 and approximately 360 nanometers. Furthermore, annealing the layers 12 and 14 as described herein provided a noticeable improvement in the reflectivity, while the addition of the reflective layer 16 (and the subsequent layers) significantly increased an overall reflectivity of the contact. For radiation having a wavelength in the ultraviolet spectral range between approximately 260 and approximately 360 nanometers, the reflectivity of the case (c) contact configuration was between approximately seventy percent and approximately eighty percent.

Considering a particular embodiment of the contact 10 with respect to radiation having a target wavelength (e.g., ultraviolet radiation): the ohmic layer 12 is formed of nickel/cobalt/palladium, has a total thickness of less than one hundred angstroms, and a transmission of at least sixty percent; the ohmic protective layer 14 is formed of rhodium, has a thickness in a range between twenty and five hundred angstroms, and a reflectivity of at least forty percent; the reflective layer 16 is formed of aluminum, has a reflectivity of at least eighty percent, and a thickness of at least two hundred nanometers; the reflector protective layer 18 has a thickness of at least three hundred angstroms; the conductive layer 20 is a highly thermally and electrically conductive low hardness layer with a thickness of at least five hundred angstroms; and the dielectric adhesion layer 22 has a thickness of at least one hundred angstroms. In each case, the reflectivity is measured at a vacuum to material interface.

Prior to formation of the contact, the semiconductor structure can be processed to improve one or more aspects of the contact. To this extent, FIG. 5 shows a portion of an illustrative device structure 30 according to an embodiment. The device structure 30 includes a contact 10A to a semiconductor layer 32. In an embodiment, a thin layer of a material 34 is deposited on the semiconductor layer 32 prior to formation of the contact 10A. The layer 34 can have a band gap that is narrower than a band gap of the layer 32. The layers 32, 34 can be formed of any suitable material based on one or more target attributes of the device corresponding to the device structure 30. In an embodiment, the layers 32, 34 are group III-V semiconductor layers, such as group III nitride layers. In a more particular embodiment, the layer 32 is formed of AlGaN, and the layer 34 is formed of GaN. The layer 34 can have a thickness less than approximately fifty nanometers, e.g., on the order of a few nanometers or less. Furthermore, the layer 34 can be doped. The doping can be p-type or n-type. In an embodiment, the layer 34 is polarization doped, which can allow for better ohmic contact with the semiconductor layer 32. For example, the layer 34 can comprise a thin layer of highly doped GaN, which is either n-type or p-type and has a gallium content of more than eighty percent. Alternatively, the layer 34 can be formed of $In_xAl_yGa_{1-x-y}N$, where $0 \le x$, $y \le 1$, and $x+y \le 1$. Additionally, the layer 32 can comprise a graded GaN—AlGaN region.

In an embodiment, one or more of the layers of a contact and/or a device described herein can have a laterally inhomogeneous structure. To this extent, the layer 32 can be laterally inhomogeneous, e.g., which can provide inhomogeneous conductive and/or transparent properties for the layer 34 in the lateral direction. Additionally, the contact 10A is shown including a laterally inhomogeneous ohmic layer. In particular, the ohmic layer is formed of a plurality of ohmic islands 12A-12F. The ohmic islands 12A-12F can be randomly located or patterned. An alignment of the ohmic islands 12A-12F above the inhomogeneous regions of the semiconductor layer 32 can be either random or predetermined through, for example, semiconductor layer patterning and overgrowth, ohmic layer patterning, and/or the like.

In an embodiment, an ohmic layer material is deposited and subsequently annealed with an ohmic protective layer 14A, which forms randomly positioned islands 12A-12F embedded into the ohmic protective layer 14A. Alternatively, the ohmic layer material can be annealed prior to the deposition of the ohmic protective layer 14A. In this case, the ohmic islands 12A-12F can act as nucleation sites for the deposition of the ohmic protective layer 14A (or another ohmic layer). The ohmic islands 12A-12F can have ohmic contact properties with the underlying semiconductor layer 34 and transparent properties, one or both of which can differ from the conductive and transparent properties at the intermittent regions between the ohmic islands 12A-12F.

Alternatively, the ohmic islands 12A-12F can be patterned. For example, the ohmic islands 12A-12F can form a photonic crystal. Similarly, the underlying semiconductor layer 34 can be patterned. In an embodiment, a characteristic size of the pattern is at the nano-scale. The patterning of the ohmic islands 12A-12F and/or the semiconductor layer 34 can provide control over a size, position, relative distance between the ohmic islands 12A-12F, and/or the like. The ohmic islands 12A-12F and/or semiconductor layer 34 can be patterned using any solution, such as etching, masking, and/or the like. In an embodiment, the ohmic layer partially penetrates the semiconductor layer 34, e.g., by heating the semiconductor layer 34 during the deposition of the ohmic layer.

In an embodiment, one or more aspects of the ohmic layer can be configured based on a target set of electrical properties for the interface between the layer 34 and the contact 10A. For example, when the ohmic islands 12A-12F are formed during annealing, a thickness of the ohmic layer material that is deposited prior to annealing can be selected such that after annealing, an average distance between the ohmic islands 12A-12F is less than or comparable to a current spreading length in the underlying semiconductor layer 34, while the ohmic islands 12A-12F cover a sufficient area of the semiconductor layer 34 to provide a reliable and operationally stable ohmic contact 10A. Furthermore, a characteristic area of the ohmic islands 12A-12F and a characteristic separation D between the ohmic islands 12A-12F can be such that a contact resistance of the contact 10A per unit area divided by the characteristic area of the ohmic islands 12A-12F differs by less than a factor of ten from a sheet resistance of the semiconductor layer 34 multiplied by a characteristic separation D between adjacent ohmic islands 12A-12F and divided by the characteristic width of the ohmic islands 12A-12F.

In another embodiment, another ohmic metallic layer, e.g., a layer of palladium, is annealed with the ohmic layer instead of the ohmic protective layer 14A. Alternatively, a contact can include ohmic islands intermitted by another metallic layer, which forms a Schottky contact with the underlying semiconductor layer. To this extent, FIG. 6 shows a portion of an illustrative device structure 40 according to another embodiment. The device structure 40 includes a semiconductor layer 42, such as a group III nitride semiconductor layer, on which is located a contact 10B. The contact 10B includes a set of ohmic islands 44A-44C intermitted by another set of islands 46A-46C, which may or may not be continuous. In an embodiment, both sets of islands 44A-44C, 46A-46C are formed of different types of metals, e.g., cobalt and nickel. In a further embodiment, the set of islands 46A-46C can comprise a metal with a low work function, such as titanium, and form a Schottky contact with the semiconductor layer 42.

As discussed herein, the reflective properties of the ohmic islands, such as the ohmic islands 12A-12F of FIG. 5 or the ohmic islands 44A-44C of FIG. 6, can differ from the reflective properties of the interspersed layer of material, such as the ohmic protective layer 14A or the set of islands 46A-46C. In an embodiment, the interspersed layer of material can be highly reflective of radiation having a target wavelength (e.g., ultraviolet radiation), while the ohmic islands are substantially transmissive or absorbing of radiation having the target wavelength. For example, the interspersed layer of material can have a reflectivity higher than approximately sixty percent (as measured at a vacuum to layer interface) for ultraviolet radiation having a target wavelength. Regardless, the interspersed layer of material can partially overlap the ohmic layer, alloy with the ohmic layer, be directly above the ohmic layer, be between the islands of the ohmic layer, or any combination thereof.

Figure 7:
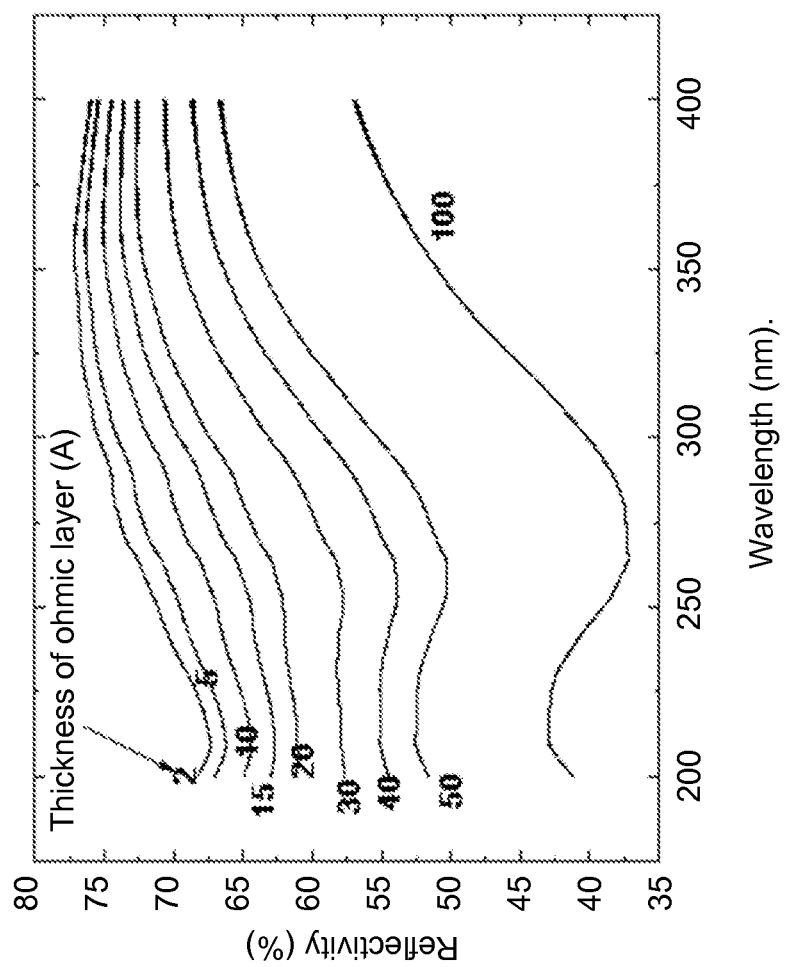
FIG. 7 shows an illustrative graph of an effect of a thickness of the ohmic layer on a reflectivity of the contact for various wavelengths of radiation according to an embodiment.

As described herein, the ohmic layer of the contacts described herein can be sufficiently thin to provide insignificant absorbance of radiation of a target wavelength (e.g., ultraviolet radiation) while providing a reasonably low contact resistance for the contact. FIG. 7 shows an illustrative graph of an effect of a thickness of the ohmic layer on a reflectivity of the contact for various wavelengths of radiation according to an embodiment. In this case, the ohmic layer was formed of nickel. As illustrated, to ensure a reflectivity of at least fifty percent for radiation of any wavelength between 200 and 400 nanometers, the ohmic layer should have a thickness less than approximately 50 Angstroms (A).

Figure 8:
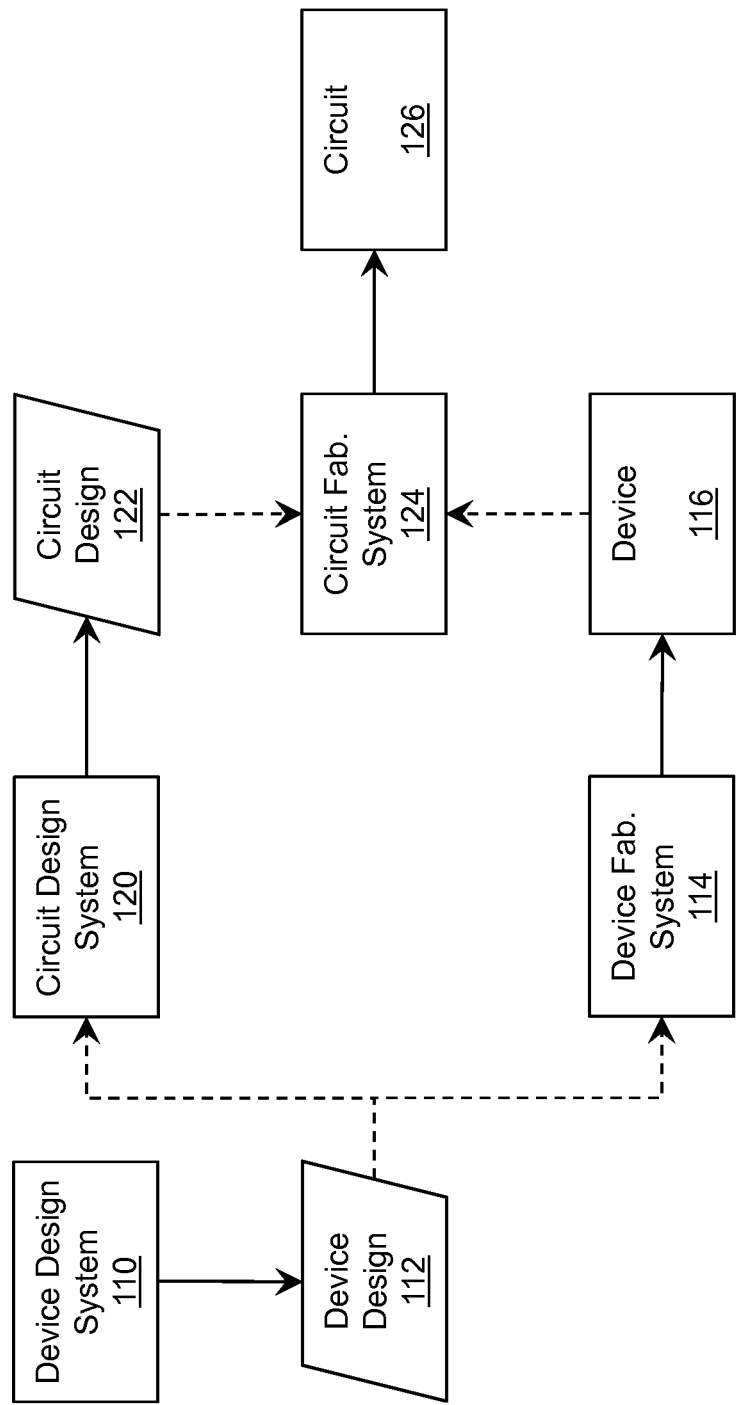
FIG. 8 shows an illustrative flow diagram for fabricating a circuit according to an embodiment.

In one embodiment, the invention provides a method of designing and/or fabricating a circuit that includes one or more of the devices designed and fabricated as described herein (e.g., including one or more contacts configured as described herein). To this extent, FIG. 8 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A contact comprising:
an ohmic layer, wherein the ohmic layer is transparent to radiation having a target wavelength, wherein the ohmic layer includes a plurality of islands, and wherein an average distance between the plurality of islands is less than a current spreading length of a semiconductor layer adjacent to the contact; and
a reflective layer located on the ohmic layer, wherein the reflective layer is at least approximately eighty percent reflective of radiation having the target wavelength, and wherein the target wavelength is within a range of wavelengths between approximately 260 and approximately 360 nanometers.

2. The contact of claim 1, further comprising an ohmic protective layer located between the ohmic layer and the reflective layer, wherein the ohmic protective layer is configured to prevent diffusion of the reflective layer into the ohmic layer.

3. The contact of claim 2, wherein the ohmic protective layer comprises rhodium.

4. The contact of claim 1, further comprising a conductive layer located on the reflective layer, wherein the conductive layer is formed of a material having a high electrical conductivity.

5. The contact of claim 4, further comprising a reflector protective layer located between the reflective layer and the conductive layer, wherein the reflector protective layer is configured to prevent diffusion of the conductive layer into the reflective layer.

6. The contact of claim 4, further comprising a dielectric adhesion layer located on the conductive layer, wherein the dielectric adhesion layer is configured to promote adhesion of an insulating dielectric film to the contact.

7. The contact of claim 1, wherein the ohmic layer is formed of at least two metals.

8. The contact of claim 7, wherein the ohmic layer has a delta composition profile.

9. A device comprising:
a first semiconductor layer; and
a contact to the first semiconductor layer, wherein the contact includes:
an ohmic layer, wherein the ohmic layer is transparent to radiation having a target wavelength, wherein the ohmic layer includes a plurality of islands, and wherein an average distance between the plurality of islands is less than a current spreading length of the first semiconductor layer; and
a reflective layer located on the ohmic layer, wherein the reflective layer is at least approximately eighty percent reflective of radiation having the target wavelength, and wherein the target wavelength is within a range of wavelengths between approximately 260 and approximately 360 nanometers.

10. The device of claim 9, the contact further including an ohmic protective layer located between the ohmic layer and the reflective layer, wherein the ohmic protective layer is configured to prevent diffusion of the reflective layer into the ohmic layer.

11. The device of claim 9, the contact further including a conductive layer located on the reflective layer, wherein the conductive layer is formed of a material having a high electrical conductivity.

12. The device of claim 9, wherein the ohmic layer partially penetrates the first semiconductor layer.

13. The device of claim 9, wherein the reflective layer is interspersed with the plurality of islands of the ohmic layer.

14. The device of claim 9, wherein the ohmic layer is formed of a first sub-layer of a first metal and a second sub-layer of a second metal distinct from the first metal.

15. The device of claim 9, further comprising a second semiconductor layer located between the first semiconductor layer and the contact, wherein the second semiconductor layer has a band gap narrower than a band gap of the first semiconductor layer, and wherein the second semiconductor layer has a thickness less than approximately fifty nanometers.

16. The device of claim 15, wherein the first and second semiconductor layer are formed of group III nitride materials, and wherein the second semiconductor layer has a gallium content of at least eighty percent.

17. The device of claim 9, wherein a surface of the semiconductor layer below the contact is patterned, wherein the pattern has a nanoscale characteristic size.

18. The device of claim 9, wherein the first semiconductor layer has at least one of: a laterally inhomogeneous electrical conductivity or a laterally inhomogeneous reflectivity.

19. A device comprising:

a first group III nitride semiconductor layer;

a second group III nitride semiconductor layer located on the first semiconductor layer, wherein the second semiconductor layer has a band gap narrower than a band gap of the first semiconductor layer, and wherein the second semiconductor layer has a thickness less than approximately fifty nanometers; and a contact located on the second semiconductor layer, wherein the contact includes:

an ohmic layer, wherein the ohmic layer is transparent to radiation having a target wavelength, wherein the ohmic layer includes a plurality of islands, and wherein an average distance between the plurality of islands is less than a current spreading length of the second group III nitride semiconductor layer; and a reflective layer located on the ohmic layer, wherein the reflective layer is at least approximately eighty percent reflective of radiation having the target wavelength, and wherein the target wavelength is within a range of wavelengths between approximately 260 and approximately 360 nanometers.

20. The device of claim 19, the contact further including a conductive layer located on the reflective layer, wherein the conductive layer is formed of a material having a high electrical conductivity.

21. The device of claim 19, wherein the device is configured to operate as a deep ultraviolet light emitting device.

* * * * *